United States Patent
Ishizaka et al.

(10) Patent No.: US 7,323,942 B2
(45) Date of Patent: Jan. 29, 2008

(54) DUAL LOOP PLL, AND MULTIPLICATION CLOCK GENERATOR USING DUAL LOOP PLL

(75) Inventors: Takashi Ishizaka, Yokohama (JP); Kazuaki Sogawa, Katano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 48 days.

(21) Appl. No.: 11/320,848

(22) Filed: Dec. 30, 2005

(65) Prior Publication Data

US 2006/0158259 A1 Jul. 20, 2006

(30) Foreign Application Priority Data

Jan. 6, 2005 (JP) ............................. 2005-001547

(51) Int. Cl.
*H03L 7/00* (2006.01)
*H03L 7/087* (2006.01)

(52) U.S. Cl. ..................... 331/10; 331/11; 331/25; 331/44; 331/175; 327/157

(58) Field of Classification Search ............... 331/2, 331/10, 11, 14, 18, 25, 1 A, 44, 46, 175; 327/156, 157
See application file for complete search history.

(56) References Cited

U.S. PATENT DOCUMENTS 6,150,886 A * 11/2000 Shimomura ................ 331/2

(Continued)

FOREIGN PATENT DOCUMENTS

JP 52-060052 5/1977

(Continued)

OTHER PUBLICATIONS

Yi-Cheng Chang and Edwin W. Greeneich, "Monolithic phase-locked loop circuit with coarse-steering acquisition aid," Circuit and Systems, 1999, 42nd Midwest Symposium on, vol. 1, 1999, pp. 283-286.

(Continued)

*Primary Examiner*—Robert Pascal
*Assistant Examiner*—Ryan J Johnson
(74) *Attorney, Agent, or Firm*—Greenblum & Bernstein, P.L.C.

(57) ABSTRACT

To provide dual loop PLLs capable of reducing the lock-up time in the initial start-up, and multiplication clock generators contributing to reduction of the power dissipation. The dual loop PLL comprises a dual loop PLL having a phase comparison loop having a phase comparator 1 for comparing phases, and a frequency comparison loop having a frequency comparator 7 for comparing frequencies, wherein the frequency comparator 7 carries out frequency comparison using an input signal inputted from a calibration clock line CLcal 18, the input signal being different from a reference clock signal inputted from an external reference clock line CLex 11, the reference clock signal being used for a phase comparator 1. Moreover, multiplication clock generators are configured using the dual loop PLL.

2 Claims, 8 Drawing Sheets

U.S. PATENT DOCUMENTS

| | | |
|---|---|---|
| 6,466,096 B1 * | 10/2002 | DeVito ........................ 331/11 |
| 7,065,017 B2 | 6/2006 | Nishida |
| 2004/0196107 A1 | 10/2004 | Sogawa et al. |
| 2005/0137816 A1 * | 6/2005 | Chuang et al. ............. 702/106 |

FOREIGN PATENT DOCUMENTS

| | | |
|---|---|---|
| JP | 2000-307420 | 11/2000 |
| JP | 2001-136065 | 5/2001 |
| JP | 2002-352517 | 12/2002 |
| JP | 2003-298417 | 10/2003 |
| WO | 03/090358 | 10/2003 |

OTHER PUBLICATIONS

English language Abstract of JP 2001-136065.
English language Abstract of JP 52-060052.
English language Abstract of JP 2002-352517.
English language Abstract of JP 2003-298417.
English language Abstract of JP 2000-307420.

* cited by examiner

DUAL LOOP PLL, AND MULTIPLICATION CLOCK GENERATOR USING DUAL LOOP PLL

BACKGROUND OF THE INVENTION

1. Field of the Invention

The present invention relates to dual loop PLLs (Phase Looked Loop) having a frequency comparison loop and a phase comparison loop, and to multiplication clock generators using the dual loop PLL.

2. Description of Related Art

Conventionally, as the PLL included in multiplication clock generators or the like, there is known a dual loop PLL having a frequency comparison loop and a phase comparison loop, the dual loop PLL for obtaining wideband phase synchronization without increasing the gain of a voltage controlled oscillator. An example thereof is disclosed, for example, in the following Non-Patent Document 1. Yi-Cheng Chang, Edwin W. Greeneich, "MONOLITHIC PHASE-LOCKED LOOP CIRCUITS WITH COARSE-STEERING ACQUISITION AID" Circuits and Systems, 1999. 42nd Midwest Symposium on, Volume: 1, 1999 Page(s): 283-286 vol. 1

The dual loop PLL has the advantage of decreasing the influence, which the variations of an input voltage to a voltage controlled oscillator have on the oscillation frequency, because the gain of the voltage controlled oscillator can be reduced even if the dual loop PLL is wide-banded. Moreover, this dual loop PLL has the function to autonomously correct the characteristics of the voltage controlled oscillator to the required characteristics by the frequency comparison even if the characteristics of the voltage controlled oscillator vary due to variations in the manufacturing process.

FIG. 8 shows an example of a circuit configuration of a conventional dual loop PLL. The dual loop PLL shown in FIG. 8 comprises a phase comparator $1p$, a charge pump $2p$, an operation mode selector switch $3p$ that switches between a phase comparison loop (P side) and a frequency comparison loop (F side), a loop filter $4p$, a voltage controlled oscillator (VCO) $5p$, a frequency divider $6p$, a frequency comparator $7p$, an up/down counter $8p$, a VCO characteristic control circuit $9p$, a voltage reference (Vref) $10p$, an external reference clock line CLex $11p$, an internal clock line CLin $12p$, a frequency comparison stop signal line FSTOP $13p$, a PLL power-on control line PON $14p$, and an output line OUT $15p$ of the voltage controlled oscillator $5p$.

Hereinafter, the operation of the dual loop PLL is described with reference to FIG. 8.

First, in the state where an enable signal is inputted to the PLL power-on control line PON $14p$, the dual loop PLL sets the operation mode selector switch $3p$ to the F side, and thereby the input voltage to the loop filter $4p$ is a voltage from the voltage reference Vref $10p$ and the loop from the phase comparator $1p$ is open. Thus, the loop is a frequency comparison loop passing through the frequency comparator $7p$, up/down counter $8p$, VCO characteristic control circuit $9p$, voltage controlled oscillator $5p$, and frequency divider $6p$.

In the above-described frequency comparison loop, a fixed reference voltage is supplied to the input voltage of the voltage controlled oscillator $5p$ from the voltage reference Vref $10p$, and the voltage controlled oscillator $5p$ operates only in the frequency comparison mode. In this frequency comparison mode, the frequency comparator $7p$ compares the frequency of the internal clock line CLin $12p$, which is obtained by dividing the output frequency of the voltage controlled oscillator $5p$ by the frequency divider $6p$, with the frequency of the external reference clock line CLex $11p$, and outputs an UP signal when the frequency of the external reference clock line CLex $11p$ is higher than the frequency of the internal clock line CLin $12p$, and outputs a DOWN signal when it is lower. Here, the UP signal is a signal to operate as to increase the counter value of the up/down counter $8p$, and the DOWN signal is a signal to operate as to decrease the counter value of the up/down counter $8p$.

Upon receipt of the UP signal or DOWN signal from the frequency comparator $7p$, the up/down counter $8p$ will add or subtract "1" to/from the count value in response to this signal. The VCO characteristic control circuit $9p$ receives a digital output from the up/down counter $8p$, and shifts the V-F characteristics (the input voltage-output frequency characteristic) of the voltage controlled oscillator $5p$ in response to this digital output value, thereby changing the output frequency of the voltage controlled oscillator $5p$. Accordingly, the frequency of the internal clock line CLin $12p$ will increase or decrease to come closer to the frequency of the external reference clock line CLex $11p$.

A series of operations of: carrying out the frequency comparison of the external reference clock line CLex $11p$ with the internal clock line CLin $12p$; changing the count value of the up/down counter $8p$ in response to the results of the comparison; and changing the V-F characteristics of the voltage controlled oscillator $5p$ by means of the VCO characteristic control circuit $9p$ to bring the frequency of the internal clock line CLin $12p$ closer to the frequency of the external reference clock line CLex $11p$, will be repeated until the both frequencies become substantially equal, and a signal is outputted to the frequency comparison stop signal line FSTOP $13p$ from the frequency comparator $7p$.

When the frequency comparison stop signal is outputted to the frequency comparison stop signal line FSTOP $13p$ from the frequency comparator $7p$, the count value of the up/down counter $8p$ is fixed. Moreover, the operation mode selector switch $3p$ switches from the F side to the P side, and the output side of the charge pump $2p$ is coupled to the input side of the loop filter $4p$. Accordingly, the loop switches to the phase comparison loop passing through the phase comparator $1p$, charge pump $2p$, loop filter $4p$, voltage controlled oscillator $5p$, and frequency divider $6p$.

In this phase comparison loop, the phase comparator $1p$ carries out phase comparison of the external reference clock line CLex $11p$ with the internal clock line CLin $12p$, and outputs an UP signal for the time period corresponding to the phase difference when the phase of the external reference clock line CLex $11p$ leads to the phase of the internal clock line CLin $12p$, and outputs a DOWN signal for the time period corresponding to the phase difference when it lags. The charge pump $2p$ charges and discharges the loop filter $4p$ in response to the UP signal and DOWN signal from the phase comparator $1p$. The loop filter $4p$ integrates the charge and discharge currents from the charge pump $2p$ to convert them to a DC voltage, which is employed as an input voltage to the voltage controlled oscillator $5p$. This input voltage will change the output frequency of the voltage controlled oscillator $5p$.

By repeating a series of these operations, finally the phase of the external reference clock line CLex $11p$ and the phase of the internal clock line CLin $12p$ are synchronized with each other, and at the output of the voltage controlled oscillator $5p$ a signal (a clock) synchronized with the external reference clock line CLex $11p$, the frequency of the signal being N-times multiplied (N is a frequency dividing ratio of the frequency divider 6p), is obtained.

However, in the multiplication clock generator by the conventional dual loop PLL, the frequency comparison and phase comparison are carried out by the same reference clock, and the frequency comparison operation and phase comparison operation are carried out during the initial start-up of the dual loop PLL, thereby increasing the lock-up time. Moreover, the increase of the lock-up time would be a cause of the increased power dissipation. In digital systems such as a portable communication apparatus, although as a method for reducing the power dissipation of systems there is a technique of intermittently operating the clock, the reduction of the lock-up time will be a problem in case of intermittently operating the dual loop PLL.

SUMMARY OF THE INVENTION

It is the object of the present invention to provide dual loop PLLs capable of reducing the lock-up time in the initial start-up, and multiplication clock generators that contribute to reduction of the power dissipation.

According to an aspect of the invention, a dual loop PLL includes: a phase comparison loop having a phase comparator for comparing phases; and a frequency comparison loop having a frequency comparator for comparing frequencies, wherein the frequency comparator carries out frequency comparison using an input signal different from a reference clock input signal used for the phase comparator.

According to an aspect of the invention, the dual loop PLL according to claim 1, further comprising: a voltage controlled oscillator that oscillates a clock by controlling a voltage, the voltage controlled oscillator being shared between the phase comparison loop and the frequency comparison loop; and an oscillator control circuit that stops the operation of the voltage controlled oscillator, wherein the oscillator control circuit stops the voltage controlled oscillator after completing the frequency comparison operation through the frequency comparison loop and before starting the phase comparison operation through the phase comparison loop.

According to another aspect of the invention, a multiplication clock generator includes: a first PLL (Phase Looked Loop) that receives and multiplies a first reference clock and outputs a first clock; and a second PLL that receives and multiplies a second reference clock and outputs a second clock, wherein the second PLL comprises a dual loop PLL having a phase comparison loop having a phase comparator for comparing phases, and a frequency comparison loop having a frequency comparator for comparing frequencies, wherein the phase comparator which the second PLL comprises carries out phase comparison using the second reference clock, and the frequency comparator which the second PLL comprises carries out frequency comparison using the first reference clock.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DESCRIPTION OF THE PREFERRED EMBODIMENT

The main point of the invention is that in the dual loop PLL a configuration provided with a phase comparison loop having a phase comparator for comparing phases and a frequency comparison loop having a frequency comparator for comparing frequencies is employed, wherein the frequency comparator carries out frequency comparison using an input signal different from a reference clock used for the phase comparator.

Hereinafter, preferred embodiments of the invention are described in detail with reference to the accompanying drawings.

Embodiment 1

Figure 1:
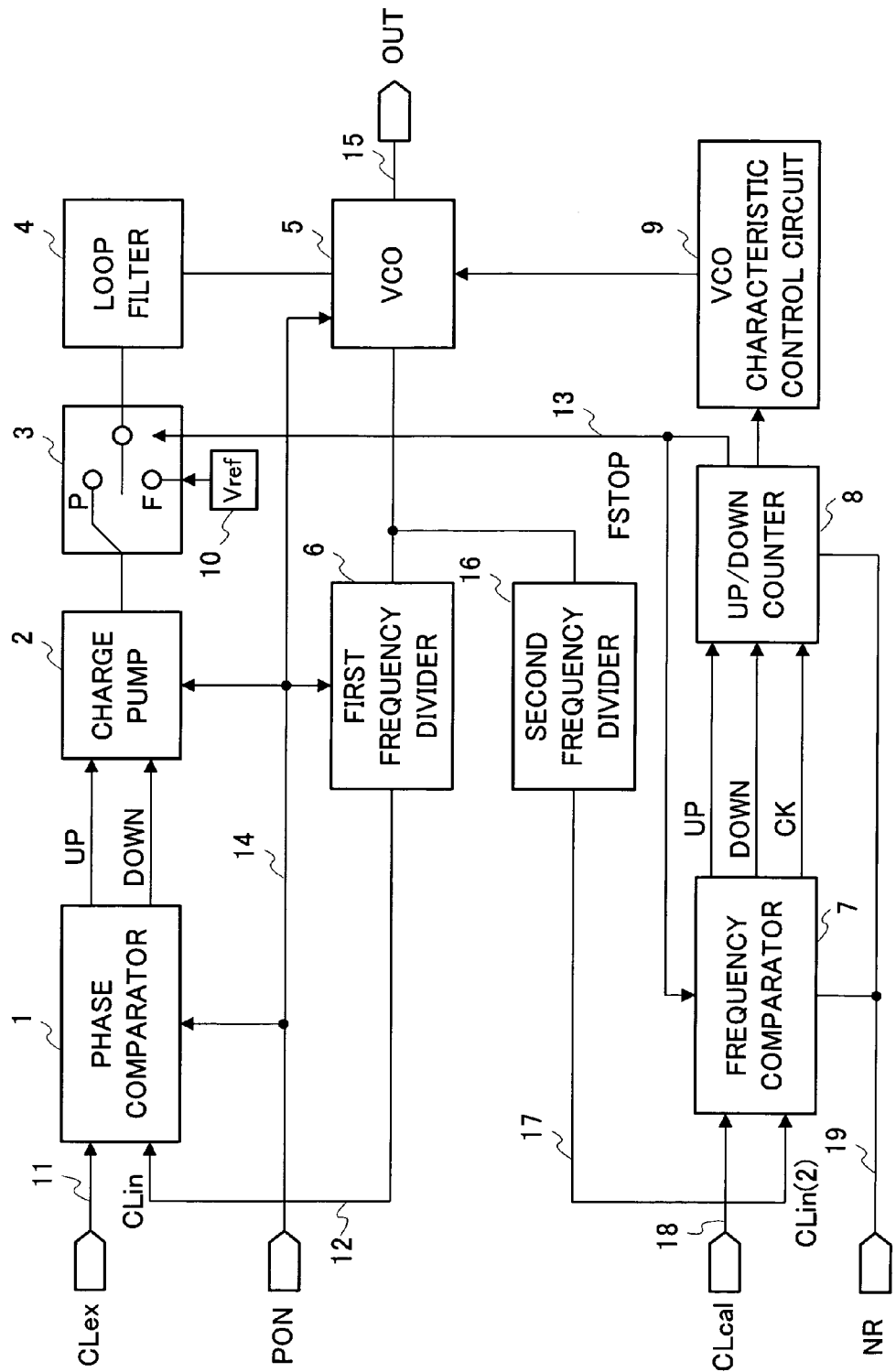
FIG. 1 is a view showing an example of the configuration of a dual loop PLL concerning an embodiment 1 of the invention.

FIG. 1 is a view showing an example of the configuration of a dual loop PLL concerning an embodiment 1 of the invention.

The dual loop PLL shown in FIG. 1 comprises a configuration in which the frequency comparison operation in the initial start-up can be carried out with an input signal different from a reference clock signal used for phase comparison. The dual loop PLL shown in FIG. 1 comprises a phase comparison loop and a frequency comparison loop. The phase comparison loop is formed from a phase comparator 1, a charge pump 2, an operation mode selector switch 3 that switches between the phase comparison loop (P side) and the frequency comparison loop (F side), a loop filter 4, a voltage controlled oscillator (VCO) 5 that oscillates a clock by controlling a voltage, and a first frequency divider 6 in the phase comparison loop. Moreover, the frequency comparison loop is formed from a frequency comparator 7, an up/down counter 8, a VCO characteristic control circuit 9, a second frequency divider 16 in the frequency comparison loop, and the voltage controlled oscillator 5.

Furthermore, the dual loop PLL shown in FIG. 1 comprises a voltage reference Vref 10, an external reference clock line CLex 11, an internal clock line CLin 12 used in the phase comparison loop, a frequency comparison stop signal line FSTOP 13, a PLL power-on control line PON 14, an output line OUT 15 of the voltage controlled oscillator 5, an internal clock line CLin(2) 17 used in the frequency comparison loop, a calibration clock line CLcal 18, and a reset signal line NR 19.

In the frequency comparison loop, the second frequency divider 16 is provided, and the calibration clock line CLcal 18, which is a signal different from the external reference clock signal, is provided, and in the state where the signal input from the external reference clock line CLex 11 is stopped, the PLL frequency comparison operation (PLL calibration operation) can be carried out.

That is, the external reference clock line CLex 11 is a line for inputting a reference clock used for the phase comparison operation, and the calibration clock line CLcal 18 is a line for inputting a reference clock used for the frequency comparison operation. Moreover, the first frequency divider 6 is adjusted such that the frequencies of the signal from the internal clock line CLin 12 of the phase comparison loop and the signal inputted from the external reference clock line CLex 11 become equal. The second frequency divider 16 is adjusted such that the frequency of the signal from the internal clock line CLin(2) 17 of the frequency comparison loop and the frequency of the signal inputted from the calibration clock line CLcal 18 become equal.

Next, the configuration and function of the PLL phase comparison loop of this embodiment is described with reference to the accompanying drawing. In FIG. 1, in the state where an enable signal "1" is inputted to the PLL power-on control line PON 14, the phase comparator 1 compares the both rising edges or the both falling edges of the signals of the external reference clock line CLex 11 and internal clock line CLin 12. The phase comparator 1 inputs to the charge pump 2 the UP signal and DOWN signals, which are the results of the comparison.

The charge pump 2 charges and discharges the loop filter 4 in response to the UP signal and the DOWN signal from the phase comparator 1. Here, the UP signal is a signal that operates the charge pump so as to increase the output frequency of the voltage controlled oscillator 5, and the DOWN signal is a signal that operates the charge pump so as to decrease the output frequency of the voltage controlled oscillator 5. The output of the charge pump 2 is coupled to the input of the operation mode selector switch 3.

In the operation mode selector switch 3, either the P side or F side is selected. When the P side is selected, the output of the charge pump 2 is coupled to the input of the loop filter 4 to form the phase comparison loop. Moreover, when the F side is selected, the input of the loop filter 4 is fixed to the voltage reference Vref 10 to form the frequency comparison loop.

In the initial state of the operation mode selector switch 3, the F side is selected, and the operation mode selector switch 3 has the function to switch to the P side from the F side using the frequency coincidence signal FSTOP 13 from the up/down counter 8 as the control signal. Furthermore, the loop filter 4 is coupled to the output side of the operation mode selector switch 3, the output of this loop filter 4 is inputted to the voltage controlled oscillator 5, and the output frequency of the voltage controlled oscillator 5 is changed based on this input voltage.

The loop filter 4 integrates the charge and discharge currents from the charge pump 2, and converts them into a DC voltage, which is employed as an input voltage to the voltage controlled oscillator 5.

The output frequency of the voltage controlled oscillator 5 is changed by this input voltage. The output signal of the voltage controlled oscillator 5 is divided by the first frequency divider 6, and inputted to the phase comparator 1 through the internal clock line CLin 12, and compared again with the signal of the external reference clock line CLex 11 by the phase comparator 1. Namely, the phase comparison loop carries out pull-in operation and lock-in operation as the dual loop PLL when the operation mode selector switch 3 is set to the P side, and N-times multiplies (N is a frequency dividing ratio of the frequency divider 6) the input signal from the external reference clock line CLex 11, and outputs it from the output line OUT 15.

Next, the configuration and function of the frequency comparison loop in this embodiment is described with reference to the accompanying drawing.

In FIG. 1, the frequency comparator 7 is initialized by the reset signal line NR 19, and receives the signal from the calibration clock line CLcal 18 and the signal, which is obtained by dividing the output of the voltage controlled oscillator 5 by the second frequency divider 16, thereby comparing the frequencies of the both clocks. The frequency comparator 7 outputs an UP signal or a DOWN signal as the signal of the comparison result. Here, the UP signal is a signal that operates as to increase the counter value of the up/down counter 8$p$, and the DOWN signal is a signal that operates as to decrease the counter value of the up/down counter 8. The frequency comparator 7 outputs a clock signal CK that operates the up/down counter 8, and stops the frequency comparison upon receipt of the signal of the frequency comparison stop signal line FSTOP 13 outputted from the up/down counter 8.

The up/down counter 8 is initialized by the reset signal line NR 19, and updates the count value upon receipt of the UP signal and DOWN signal from the frequency comparator 7.

Upon receipt of the count value of the up/down counter 8, the VCO characteristic control circuit 9 controls the V-F characteristics (the input voltage-output frequency characteristic) of the voltage controlled oscillator 5 based on this count value.

The output signal of the voltage controlled oscillator 5 is divided by the second frequency divider 16, and inputted to the frequency comparator 7 through the internal clock line CLin(2) 17.

In addition, in order to release the voltage controlled oscillator 5 from the power down state, an enable signal "1" is inputted to the PLL power-on control line PON 14.

Figure 2:
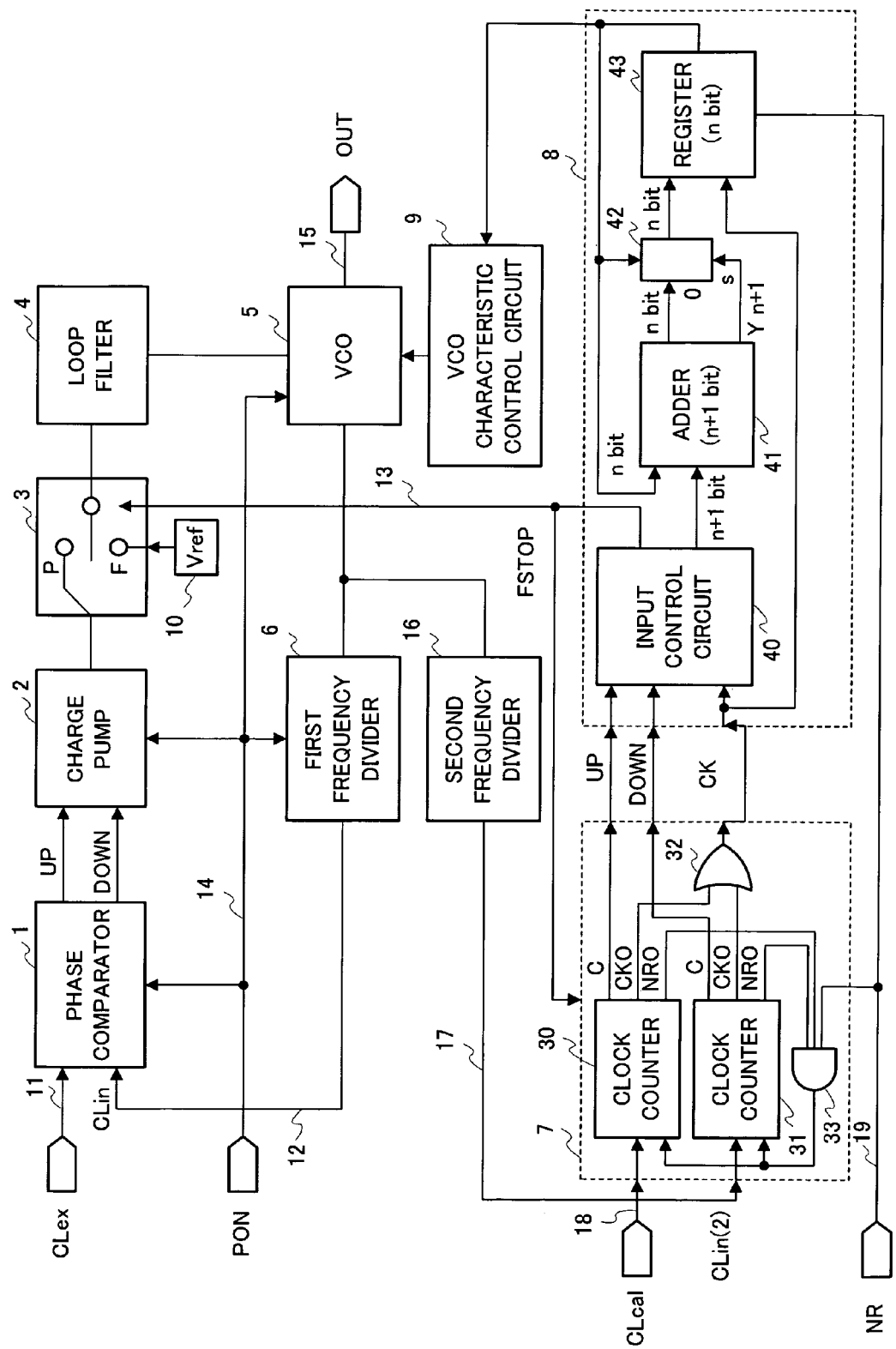
FIG. 2 is a view showing an example of the configuration of a frequency comparator and an up/down counter in the dual loop PLL of the embodiment 1.
Figure 3:
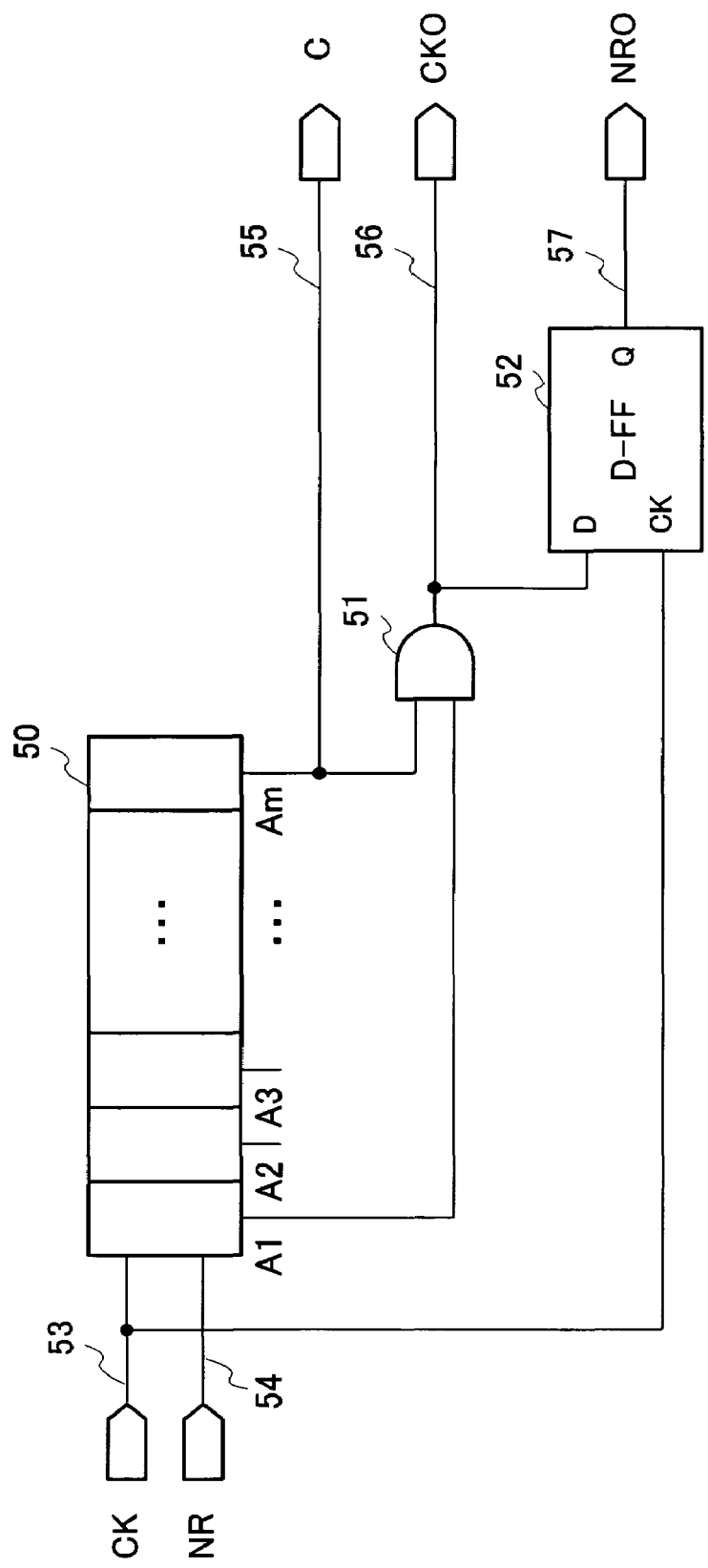
FIG. 3 is a view showing an example of the internal configuration of a clock counter included in the frequency comparator in the dual loop PLL of the embodiment 1.
Figure 4:
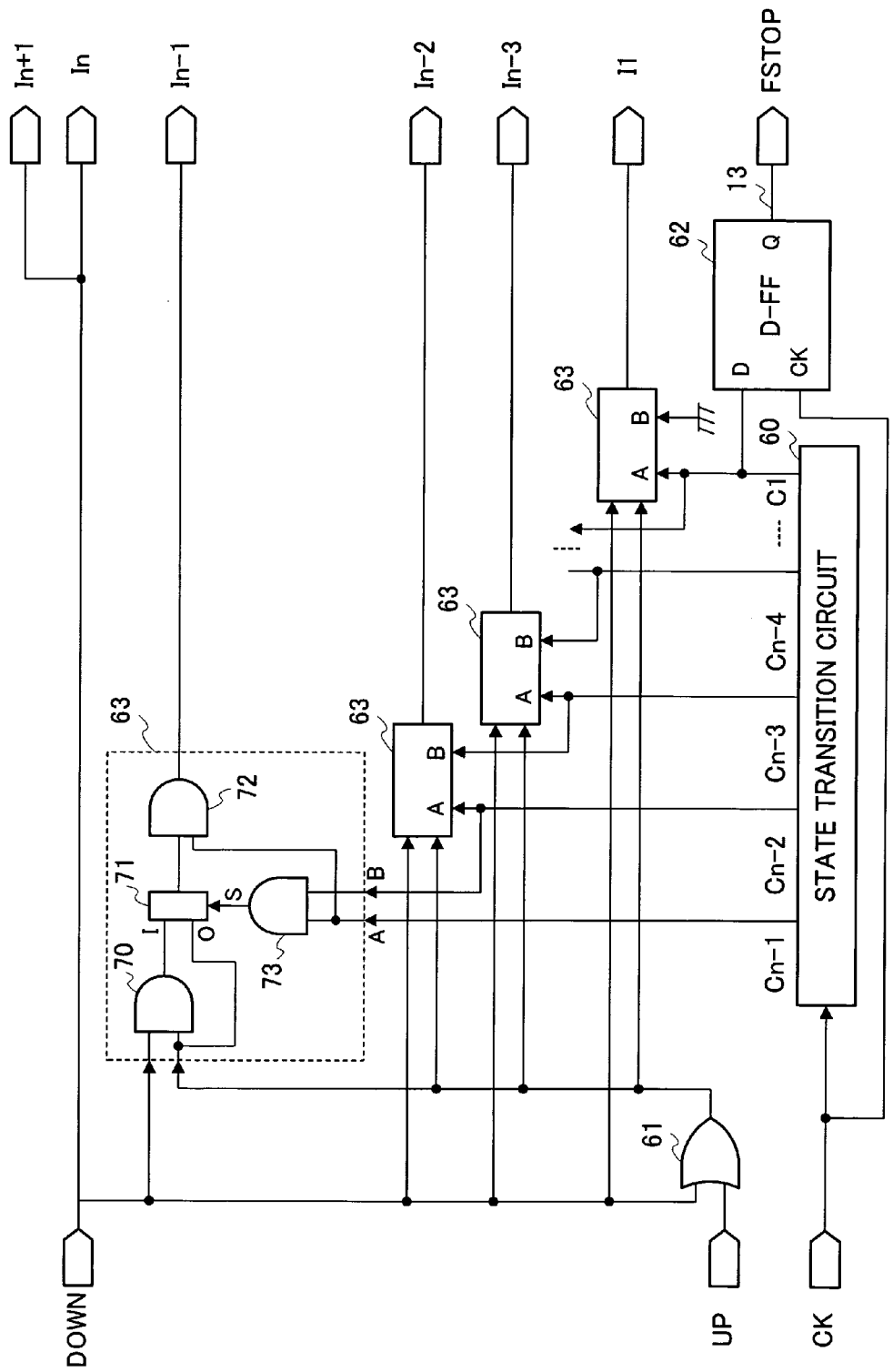
FIG. 4 is a view showing an example of the internal configuration of an input control circuit configuring the up/down counter in the dual loop PLL of the embodiment 1.

Next, the internal configurations of the frequency comparator 7 and up/down counter 8 are described with reference to FIG. 2, FIG. 3, and FIG. 4. FIG. 2 is a view showing an example of the configurations of the frequency comparator 7 and up/down counter 8 in the dual loop PLL of this embodiment. FIG. 3 is a view showing an example of the internal configuration of a clock counter included in the frequency comparator 7 in the dual loop PLL of this embodiment. FIG. 4 is a view showing an example of the internal configuration of an input control circuit included in the up/down counter 8 in the dual loop PLL of this embodiment. In addition, FIG. 2 shows a view in which examples of the configuration of the frequency comparator 7 and up/down counter 8 are added to FIG. 1.

First, the frequency comparator 7 is described. The frequency comparator 7 shown in FIG. 2 comprises clock counters 30 and 31, an OR circuit 32 to generate the operation clock CK of the up/down counter 8, an AND circuit 33 to reset the clock counters 30 and 31.

Moreover, the internal configuration of the clock counters 30 and 31 shown in FIG. 3 comprises an m-bit counter 50, an AND circuit 51, to which the most significant bit Am and the least significant bit A1 are inputted, and a D-type flip flop circuit 52 whose data input is the output of the AND circuit 51. Furthermore, the clock counters 30 and 31 of FIG. 3 comprise a clock input line CK 53 coupled to the input of the m-bit counter 50 and the clock input of the D-type flip flop circuit 52, a reset input line NR 54 coupled to the reset input of the m-bit counter 50, an output line C 55 to output the value of the most significant bit Am of the m-bit counter 50, an output line CKO 56 of the AND circuit 51, and an output line NRO 57 of the D-type flip flop circuit 52.

In the frequency comparator 7 shown in FIG. 2, the calibration clock line CLcal 18 to be inputted to the clock counter 30, and the internal clock line CLin(2) 17 to be inputted to the clock counter 31 are coupled to the input corresponding to the clock input line CK 53 of FIG. 3, respectively. The input lines to the clock counter 30 and clock counter 31 of FIG. 2 from the output of the AND circuit 33 are coupled to the input corresponding to the reset input line NR 54 of FIG. 3, respectively. Moreover, the respective NRO outputs (the outputs corresponding to the output line NRO 57 of the D-type flip flop circuit 52 in FIG. 3) of the clock counter 30 and the clock counter 31 shown in FIG. 2, together with the reset signal line NR 19, are inputted to the AND circuit 33 of FIG. 2. Furthermore, a C-output (an output corresponding to the output line C 55 of FIG. 3) of the clock counter 30 shown in FIG. 2 is coupled to the UP signal output of the frequency comparator 7, and the C output (the output corresponding to the output line C 55 of FIG. 3) of the clock counter 31 shown in FIG. 2 is coupled to the DOWN signal output of the frequency comparator 7. CKO outputs (the outputs corresponding to the output line CKO 56 of FIG. 3) of the clock counter 30 and the clock counter 31 shown in FIG. 2 are inputted to the OR circuit 32 of FIG. 2, and the output of the OR circuit 32 is coupled to a CK output of the frequency comparator 7.

The up/down counter 8 shown in FIG. 2 comprises an input control circuit 40, an adder 41, a selector 42, and a register 43. The input control circuit 40 receives the UP signal, DOWN signal, and CK signal. The adder 41 is an n+1 bit adder, the inputs of which are the outputs from the input control circuit 40 and the output of the register 43. The selector 42 receives the output from the adder 41 and the output from the register 43 and selects the most significant bit of the output of the adder 41 as the control signal. The register 43 is an n-bit register to store the counter value of the up/down counter 8.

Next, the operation of the up/down counter 8 is described. The input control circuit 40 operates synchronizing with the clock signal CK from the OR circuit 32 of the frequency comparator 7, and receives the UP signal from the clock counter 30 and the DOWN signal from the clock counter 31 of the frequency comparator 7. The input control circuit 40 outputs a positive value of n+1 bits when the UP signal is received from the frequency comparator 7, and outputs a negative value of n+1 bits when the DOWN signal is received from the frequency comparator 7. Moreover, when the frequency comparison operation by the frequency comparator 7 is completed once, the OR circuit 32 will generate one clock of the clock signal CK, and the input control circuit 40 will control the absolute value of the n+1 bit value so as to be a half size thereof for each clock, and generate it. Furthermore, upon receipt of the output of the selector 42, the register 43 will latch the output of the selector 42 using the clock signal CK from the OR circuit 32 of the frequency comparator 7. Moreover, the register 43 stores the one-clock previous count-value of the up/down counter 8.

Here, in the case where the count value of the up/down counter 8 has n bits, the number of bits of the output of the input control circuit 40 and the input/output of the adder 41 consists of n+1 bits, and the number of bits of the input/output of the selector 42 and the register 43 consists of n bits, respectively. The (n+1)th bit (the most significant bit) of the output of the adder 41 is used as a sign bit. In this case, the output of the register 43 lacks one bit when it is inputted to the adder 41. This one bit is compensated for by adding "0" as the most significant bit, so that a positive value is always inputted to the adder 41 from the register 43. Furthermore, the most significant bit, i.e., the sign bit, of the output of the adder 41 is "1" when the output of the adder 41 overflows or when it is a negative value. The selector 42 receives the sign bit of the adder 41 as a control signal, and selects the register 43 side when the sign bit is "1", so that the output value of the register 43 is latched as it is in the register 43, thereby preventing the count value of the up/down counter 8 from resulting in a wrong value.

Next, the input control circuit 40 is described using FIG. 4. As shown in FIG. 4, the input control circuit 40 of the up/down counter 8 is constituted of a state transition circuit 60 having n−1 bit outputs (C1 to Cn−1), an OR circuit 61, and a D-type flip flop circuit 62 and n−1 logic circuits 63.

The state transition circuit 60 is configured such that in the initial state the most significant bit C n−1 of the output is set to "1" and all other lower bits are set to "0", and each time when receiving the clock signal CK from the frequency comparator 7, the most significant bit among the bits outputting "0" transitions to "1".

The OR circuit 61 receives the DOWN signal and UP signal from the frequency comparator 7. The internal configurations of the n−1 logic circuits 63 are mutually the same configurations, and the output Cx (x is 2 to n−1, here) of the x-th bit of the n−1 bit outputs of the state transition circuit 6 is coupled to an A-input of the x-th logic circuit 63 among the n−1 logic circuits 63, respectively, and the output Cx−1 of the (x−1)th bit of the state transition circuit 60 is coupled to a B-input of the x-th logic circuit 63, respectively. A "0" is inputted fixedly to the B-input of the logic circuit 63, in which the C1 output of the state transition circuit 60 is coupled to the A-input. The D-type flip flop circuit 62 has the least significant bit C1 of the state transition circuit 60 as the data input, and has the clock signal CK from the frequency comparator 7 as the clock input.

The logic circuit 63, as shown in FIG. 4, is constituted of an AND circuit 70, a selector 71, and AND circuits 72 and 73.

The AND circuit 70 receives the output of the OR circuit 61 and DOWN signal from the frequency comparator 7.

The selector 71 has the output of the AND circuit 70 and the output of the OR circuit 61 as its inputs, and has the output of the AND circuit 73 as the control signal, and selects the output of the AND circuit 70 when the above control signal is "1", and selects the output of the OR circuit 61 when it is "0".

The AND circuit 72 has the output of the selector 71 and the A-input of the logic circuit 63 as its inputs, and the output of the AND circuit 72 serves as the output of the logic circuit 63.

The AND circuit 73 has the A-input and the B-input of the logic circuit 63 as its inputs, and the output of the AND circuit 73 serves as the control signal of the selector 71.

Moreover, the input control circuit 40 has n+1 bit outputs (I1 to In+1), the most significant bit In+1 is used as a sign bit, and the most significant bit In+1 and In bit are constituted of the DOWN input signal of the input control circuit 40. The outputs of the I n−1 and subsequent bits are constituted of the respective output Ix (x is 1 to n−1, here)

of the n−1 logic circuits 63 having the Cx output (x is 1 to n−1, here) of the state transition circuit 60 as the A-input thereof. Furthermore, the data output of the D-type flip flop circuit 62 is configured as to be coupled to the frequency comparison stop signal line FSTOP 13.

Next, the frequency comparison operation of the dual loop PLL of the invention is described. In the frequency comparator 7 shown in FIG. 2, among the signals from the calibration clock line CLcal 18 and from the internal clock line CLin (2) 17, the signal having a higher frequency will promptly set, to "1", the most significant bit Am of the counter 50, which is included in the clock counter 30 or 31, shown in FIG. 3, and therefore the UP signal of the frequency comparator 7 will be outputted first when the signal from the calibration clock line CLcal 18 is higher than the signal from the internal clock line CLin(2) 17, and contrarily, when the signal from the calibration clock line CLcal 18 is lower than the internal clock line CLin(2) 17, the DOWN signal of the frequency comparator 7 will be outputted first.

Because the signal CKO 56 from the clock counters 30 and 31 is the logical AND of the most significant bit Am and the least significant bit A1 of the counter 50, as shown in FIG. 3, the signal CKO 56 will be outputted after one cycle of the signal inputted to the CK terminal 53 from when the C signal (UP signal or DOWN signal) is outputted. Moreover, because the clock signal CK, which is the output signal of the frequency comparator 7 shown in FIG. 2, is the logical OR of the output signals CKO 56 of the clock counters 30 and 31, the clock signal CK will be outputted in one clock after the signal from the calibration clock line CLcal 18 when an UP signal is outputted first, and the clock signal CK will be outputted in one cycle after the signal from the internal clock line CLin(2) 17 when the DOWN signal is outputted first.

Because the signal NRO 57 of the clock counters 30 and 31 is the data output of the D-type flip flop circuit 52 as shown in FIG. 3, the signal NRO 57 is outputted after one cycle of the clock signal inputted to the CK terminal 53 from when the signal CKO 56 is outputted. These signals NRO 57 are inputted to the AND circuit 33 shown in FIG. 2, respectively, and will reset the clock counters 30 and 31 themselves when the reset signal line NR 19 is "1" (reset disable).

As described above, the frequency comparator 7 outputs the UP signal or DOWN signal, and outputs the clock signal CK at the time delayed by one clock (one cycle is the cycle of one of the signal from the calibration clock line CLcal 18 or the signal from the internal clock line CLin(2) 17a which has the higher frequency) after the UP signal or DOWN signal is outputted. Then, the reset signal NRO is outputted at the time delayed by one clock (one cycle is the cycle of one of the signal from the calibration clock line CLcal 18 or the signal from the internal clock line CLin(2) 17a which has the higher frequency) after the clock signal CK is outputted, and the clock counters 30 and 31 are reset to carry out a new frequency comparison. Furthermore, the operation of the frequency comparator 7 will be repeated until the inputs to the clock counters 30 and 31 are interrupted by the input of the frequency comparison stop signal line FSTOP 13 from the up/down counter 8.

Next, the operation of the up/down counter 8 is described. In the up/down counter 8 shown in FIG. 2, the adder 41 adds the output of the input control circuit 40 to the output of the register 43, which stores the one clock previous count value of the up/down counter 8. The result of the addition will be latched by the register 43 when the register 43 receives the clock signal CK from the OR circuit 32 of the frequency comparator 7.

Here, the contents of the output of the input control circuit 40 of the up/down counter 8 is described. As shown in FIG. 4, as for the outputs of the n−1 logic circuits 63, i.e., the bits I1 to In−1 of the input control circuit 40, among these logic circuits 63, the logic circuit 63, in which the signal of the A-input of the AND circuit 73 is "1" and the signal of the B-input is "0", will output "1" when any one of the UP signal and DOWN signal is "1". The logic circuit 63, in which both signals of the A-input and the B-input are "1", will output "0" when only the UP signal is "1", and will outputs "1" when only the DOWN signal is "1". Moreover, the logic circuit 63, in which both signals of the A-input and the B-input are "0", will output "0" regardless of the UP signal or the DOWN signal. Here, the state transition circuit 60 is in the initial state immediately after being reset (in the state where only the most significant bit C n−1 is "1" and the other bits are "0", and the I n−1 bit is "1" and all the lower bits below the I n−1 bit are "0", and the higher bits, In and I n+1, above the I n−1 bit are "0" when the UP signal is inputted, and are "1" when the DOWN signal is inputted.

Namely, the n+1 bit outputs, I n+1 to I1, of the input control circuit 40 are 0010—0 (I n−1 is "1", and the other bits are "0") in descending order when the UP signal is "1" in the initial state, and are 1110—0 (I n+1, In, and I n−1 are "1" and the other bits are "0") in descending order when the DOWN signal is "1".

Subsequently, when the clock signal CK from the frequency comparator 7 is inputted to the input control circuit 40, the state transition circuit 60 will transition to the next state where the output state is such that the C n−1 bit and Cn−2 bit are "1", and the Cn−3 and subsequent bits are "0". In this state, the outputs, I n+1 to I1, of the input control circuit 40 are 00010 . . . 0 (In−2 is "1", and the other bits are "0") in descending order when the UP signal is "1", and are 11110 . . . 0 in descending order when the DOWN signal is "1" (In+1, In, I n−1, and In−2, are "1" and the other bits are "0"). The state where the next clock signal CK is inputted to the input control circuit 40 is considered in the same way. Every time the clock signal CK is inputted, the absolute value of the output value of the input control circuit 40 will change, from the initial state where the reset signal is inputted, to a ¼ of the maximum value 2N of the up/down counter 8, a ⅛ of 2N (a ½ of the previous value), a 1/16 of 2N (a ½ of the previous value), . . . , and "1". Then, the output of this input control circuit 40 is a positive value when the UP signal is inputted, and is a negative value when the DOWN signal is inputted. Here, the absolute value in the initial state is not a ½ but a ¼ of the maximum value 2N, because the value of the register 43 is a ½ of the maximum value 2N in the initial state.

As described above, when the UP signal or the DOWN signal is inputted to the up/down counter 8, the frequency comparison is carried out by the frequency comparator 7, and the output value of the input control circuit 40 is a positive value of a ½ of the previous value when the UP signal is inputted, and it is a negative value of a ½ of the previous value when the DOWN signal is inputted. Then, the output value of this input control circuit 40 is added to the count value of the register 43 by the adder 41, and the result thereof will be inputted to the register 43 again. Upon receipt of the clock signal CK from the frequency comparator 7 at the time delayed by one clock (this one cycle is the cycle of one of the signal from the calibration clock line CLcal 18 or the signal from the internal clock line CLin(2) 17 which has the higher frequency) from when the UP signal or DOWN signal from the frequency comparator 7 is outputted, the register 43 will latch the addition/subtraction value of the adder 41 at this point.

Accordingly, the count value of the up/down counter 8 will increase by a ½ of the previous value when the UP signal is inputted, and will decrease by a ½ of the previous addition/subtraction value when the DOWN signal is inputted. Subsequently, in the frequency comparator 7, at the time delayed by one clock (this one cycle is also the cycle of one of the signal from the calibration clock line CLcal 18 or the internal clock line CLin(2) 17 which has the higher frequency) after when the clock signal CK is outputted, the reset signal NRO will be outputted from the clock counter 30 or from the clock counter 31 thereby to reset the clock counter 30 and 31 themselves.

Moreover, in response to the changes of the count value of the up/down counter 8, the VCO characteristic control circuit 9 shown in FIG. 2 will change the V-F characteristics of the voltage controlled oscillator 5 according to this count value. Because the output frequency of the voltage controlled oscillator 5 changes, the frequency of the signal of the internal clock line CLin(2) 17, which is divided by the second frequency divider 16, will also change.

In the frequency comparison loop, the frequency comparison operation will be repeated, in which the frequency comparison of the signal from the calibration clock line CLcal 18 with the signal from the changed internal clock line CLin(2) 17 is carried out in the frequency comparator 7. According to the result of the comparison, the count value of the up/down counter 8 is increased or decreased by steps of a half value. Then, in the state transition circuit 60 within the input control circuit 40 of the up/down counter 8, when the clock signal CK is inputted to the input control circuit 40 from the frequency comparator 7 in the state where the least significant bit C1 is "1" (i.e., in the state where the up/down counter 8 is in the final step interval), the signal of the frequency comparison stop signal line FSTOP 13 coupled to the output of the D-type flip flop circuit 62 within this input control circuit 40 is "1". This FSTOP signal is inputted to the frequency comparator 7 and the operation mode selector switch 3, and the frequency comparator 7 stops the operation, and the operation mode selector switch 3 is switched from the F side to the P side. Moreover, the register value of the up/down counter 8 will be stored.

In this way, the frequency comparison mode is completed, while the operation loop of the PLL is switched to the phase comparison loop by the operation mode selector switch 3, and the PLL will transition to the phase comparison mode. In this way, the frequency comparison loop of the PLL of this embodiment has the function wherein the oscillation range of the voltage controlled oscillator 5 is adjusted so that the frequency of the signal from the calibration clock line CLcal 18 and the frequency of the signal of the internal-clock input CLin(2) 17 in the frequency comparison loop, the internal-clock input CLin(2) 17 being obtained by dividing the output of the voltage controlled oscillator 5 by the second frequency divider 16, become equal, and this adjusted result is stored as the counter value of the up/down counter.

Moreover, because the PLL operations in the phase comparison mode are PLL pull-in operation and lock-in operation through the phase comparison loop described in the configuration and function of the phase comparison loop, the description thereof is omitted, however, a signal, which is obtained by N-times multiplying (N is a frequency dividing ratio of the frequency divider 6) the input signal from the external reference clock line CLex 11, can be obtained from the output line OUT 15 after completing the pull-in operation. Moreover, even if a disable signal "0" is inputted to the PLL power-on control line PON 14 in order to stop the PLL, thereby powering-down the PLL, the register of the up/down counter 8 will store the value, and therefore the frequency comparison operation will not be needed when restarting the PLL by inputting an enable signal "1" to the PLL power-on control line PON 14 again.

In this way, according to the PLL of this embodiment, because the frequency comparison operation through the frequency comparison loop can be carried out even in the state where the external reference clock input signal is stopped, it is possible to carry out the PLL calibration through the frequency comparison loop in advance prior to inputting of the reference clock. Moreover, because after the inputting of the reference clock, the frequency comparison operation through the frequency comparison loop will not be needed any more, the lock-up time of the PLL in the initial start-up can be reduced.

Moreover, by preparing the second frequency divider in the frequency comparison loop it is possible to carry out the frequency comparison operation through the frequency comparison loop by using an input signal different from the reference clock input signal. With this configuration, it is possible to carry out the PLL calibration through the frequency comparison loop in advance prior to inputting of the reference clock. Moreover, because after the reference clock is inputted, the frequency comparison operation through the frequency comparison loop will not be needed any more, the lock-up time of the PLL in the initial start-up can be reduced.

Embodiment 2

Figure 5:
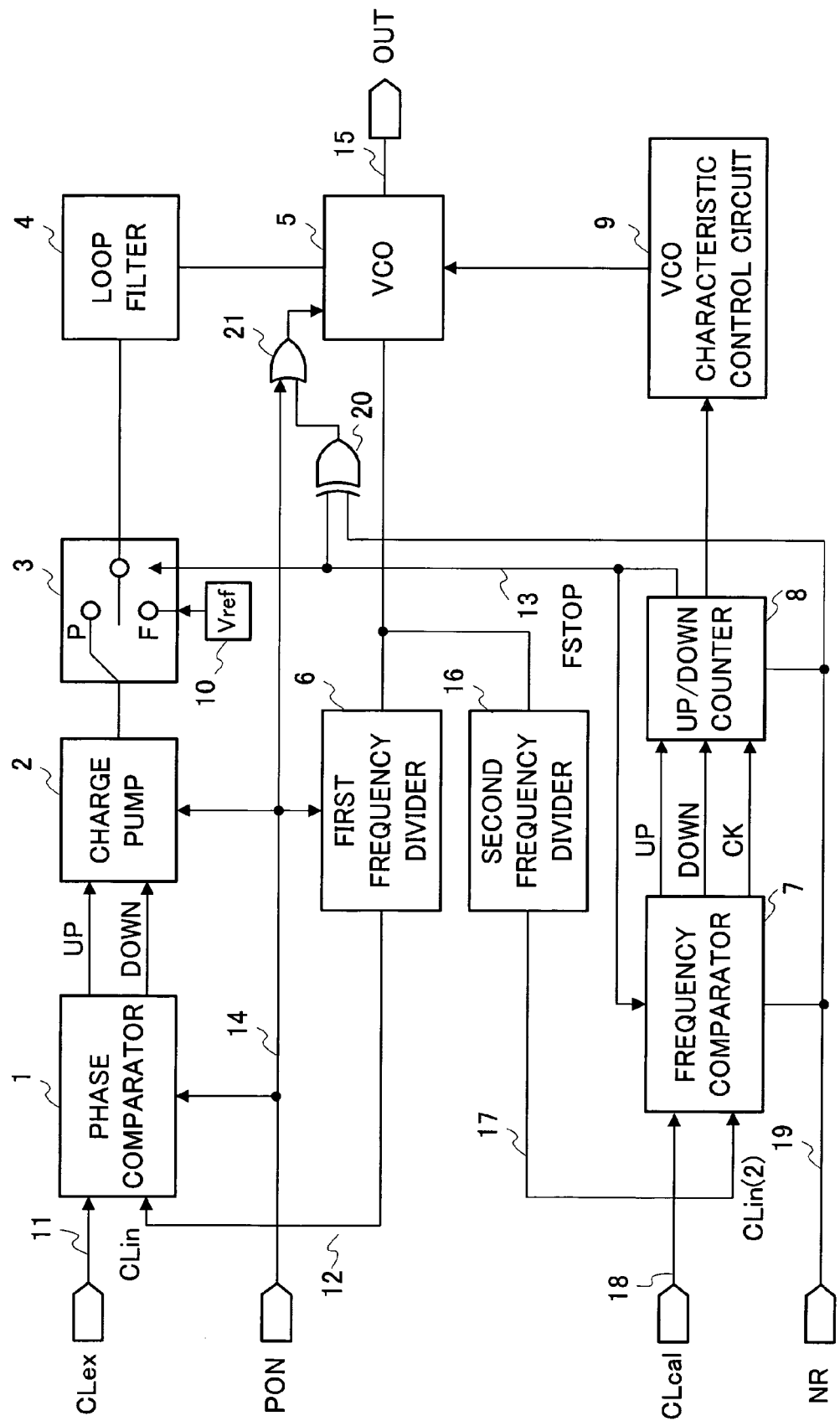
FIG. 5 is a view showing an example of the configuration of a dual loop PLL concerning an embodiment 2 of the invention.

FIG. 5 is a view showing an example of the configuration of a dual loop PLL concerning an embodiment 2 of the invention. The dual loop PLL of this embodiment comprises a device that stops a voltage controlled oscillator shared between the frequency comparison loop and the phase comparison loop after completing the frequency comparison operation through the frequency comparison loop and before starting the phase comparison operation.

The dual loop PLL shown in FIG. 5 comprises an oscillator control circuit in addition to the dual loop PLL shown in FIG. 1. In FIG. 5, there is shown an example, wherein the oscillator control circuit is constituted of an EX-OR circuit (an exclusive OR circuit) 20 and an OR circuit (a logical OR circuit) 21. In addition, because in FIG. 5 elements of the same numerals as those of FIG. 1 have the same names and same functions, the descriptions thereof are omitted.

The EX-OR circuit 20 has the frequency comparison stop signal line FSTOP 13 and the reset signal line NR 19 as its inputs. The OR circuit 21 has the output of the EX-OR circuit 20 and the PLL power-on control line PON 14 as its inputs, and the output thereof is coupled to the voltage controlled oscillator 5, as the enable signal of the voltage controlled oscillator 5. The oscillator control circuit consisting of the EX-OR circuit 20 and the OR circuit 21 has the function wherein the frequency comparison operation is enabled in the state where the disable signal is inputted to the PLL power-on control line PON 14, i.e., in the state where the operation of the PLL is stopped, and the voltage controlled oscillator 5 is recovered from the power down operation when the frequency comparison loop starts, and the voltage controlled oscillator 5 is powered down when the frequency comparison operation is completed.

Namely, when the reset release signal "1" is inputted to the reset signal line NR 19, because the signal of the frequency comparison stop signal line FSTOP 13 is "0" in the initial state, the voltage controlled oscillator 5 is recovered from the power down regardless of the signal of the PLL power-on control line PON 14 thereby to start the frequency comparison operation, and when the signal of the frequency comparison stop signal line FSTOP 13 is "1", the output of the EX-OR circuit 20 is "0" thereby to power down the voltage controlled oscillator 5.

In this way, according to the dual loop PLL of this embodiment, it is possible to stop the operation of the voltage controlled oscillator 5 after the register value of the up/down counter 8 is determined by carrying out frequency comparison after the initial start-up, and the power dissipation of the dual loop PLL can be suppressed even if taking a long time from the frequency comparison operation to the phase comparison operation.

Moreover, in addition to the effect of the lock-up time reduction of the dual loop PLL described in the embodiment 1, it is possible to stop the operation of the voltage controlled oscillator 5 after the register value of the up/down counter 8 is determined by carrying out the frequency comparison after the initial start-up. For this reason, the power dissipation of the dual loop PLL can be suppressed even if taking a long time from the frequency comparison operation to the phase comparison operation.

Embodiment 3

Figure 6:
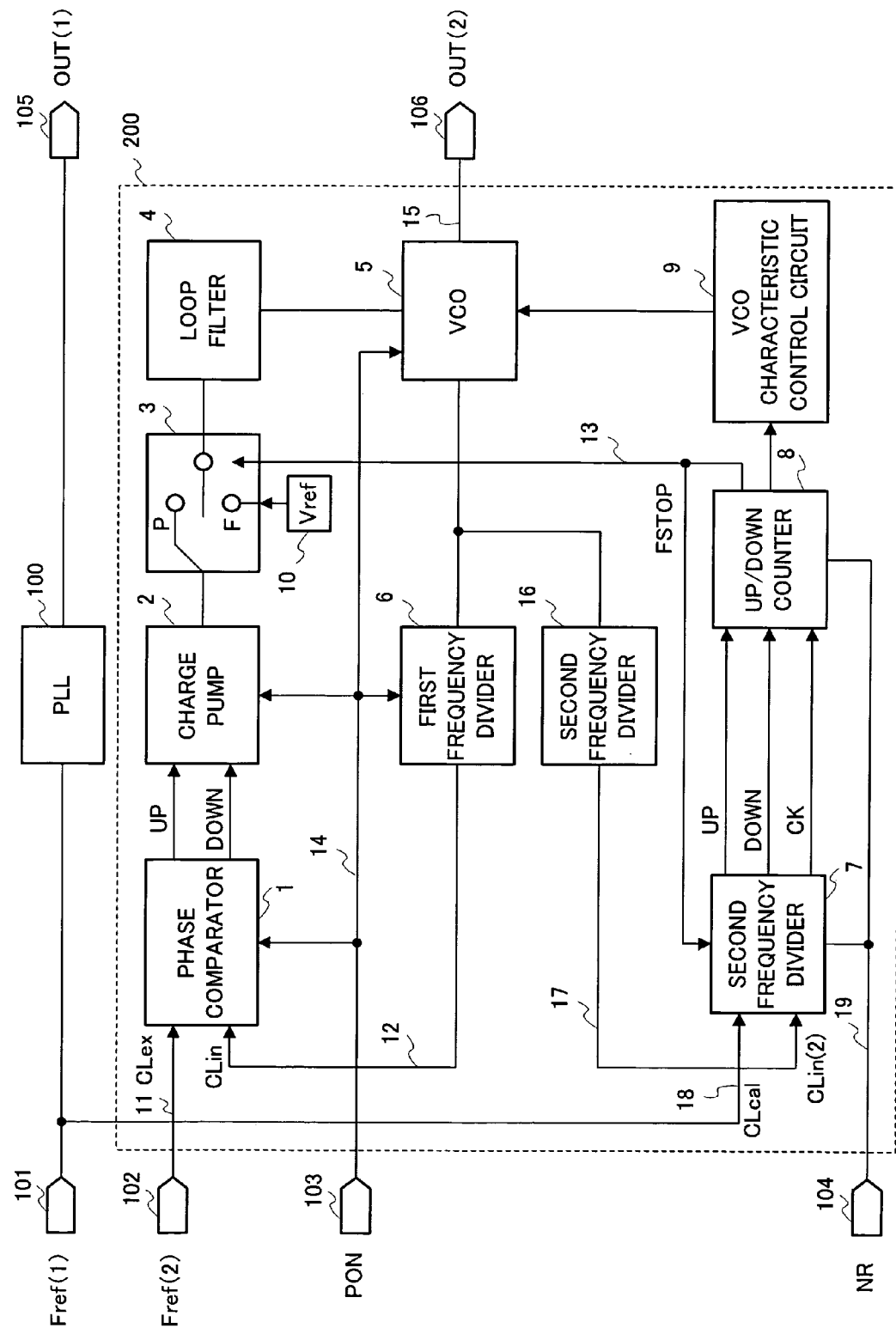
FIG. 6 is a view showing an example of the configuration of a multiplication clock generator concerning an embodiment 3 of the invention.

FIG. 6 is a view showing an example of the configuration of a multiplication clock generator concerning an embodiment 3 of the invention.

The multiplication clock generator of this embodiment comprises a plurality of reference clock inputs and a plurality of multiplication clock outputs.

The multiplication clock generator shown in FIG. 6 comprises a first PLL 100 and a second PLL 200, wherein the second PLL 200 employs the configuration of the dual loop PLL shown as an example of FIG. 1. Moreover, the multiplication clock generator shown in FIG. 6 comprises, as its inputs, a first reference clock input Fref(1) 101, a second reference clock input Fref(2) 102, the power-on control input PON 103 of the second PLL 200, and a reset input NR 104 of the second PLL 200. Moreover, a multiplication output OUT(1) 105 of the first PLL 100, and a multiplication output OUT(2) 106 of the second PLL 200 are provided as its outputs. In addition, because in FIG. 6 the elements of the same numerals as those of FIG. 1 have the same names and same functions, the descriptions thereof are omitted.

Moreover, in the multiplication clock generator shown in FIG. 6, the calibration clock line CLcal 18 of the second PLL 200 is coupled to the first PLL reference clock input Fref(1) 101. In the multiplication clock generator shown in FIG. 6, even when the second reference clock input Fref(2) 102 is stopped, an enable signal is inputted to the power-on control input PON 103 of the second PLL 200, and a signal is inputted from the first reference clock input Fref(1) 101, and a reset release signal is inputted from the reset input NR 104 of the second PLL 200, and thereby the V-F characteristic control (PLL calibration) of the voltage controlled oscillator 5 through the frequency comparison loop of the second PLL 200 can be carried out.

Moreover, as the first reference clock, a reference clock, such as an RTC (a real-time clock), which is always operating during the system operation time period, may be selected. Moreover, as the second reference clock, a reference clock that is operated intermittently may be selected. In this case, according to the multiplication clock generator of this embodiment, while the signal input from the second reference clock input Fref(2) 102 is stopped, the calibration of the second PLL 200 can be carried out by the signal from the first reference clock input Fref(1) 101, which is always operating, and therefore, the lock-up time during the initial start-up of the second PLL 200 can be reduced. Moreover, the second reference clock input Fref(2) 102 can be stopped until when the start-up of the second PLL 200 is needed.

In this way, according to the multiplication clock generator of this embodiment, because the calibration of the second PLL 200 can be carried out in advance by the signal from the first reference clock input Fref(1) 101 while the signal input from the second reference clock input Fref(2) 102 is stopped, the lock-up time during the initial start-up of the second PLL 200 can be reduced. Moreover, because an external reference clock oscillator for generating the signal to be inputted to the second reference clock input Fref(2) 102 can be stopped until when the start-up of the second PLL 200 is needed, it is effective in reducing the power dissipation of systems.

In addition, the configuration of the first PLL 100 may be the one in the case where the dual loop PLL shown in FIG. 1 or FIG. 5 is used, or may be the one in the case where other PLL is used.

Embodiment 4

Figure 7:
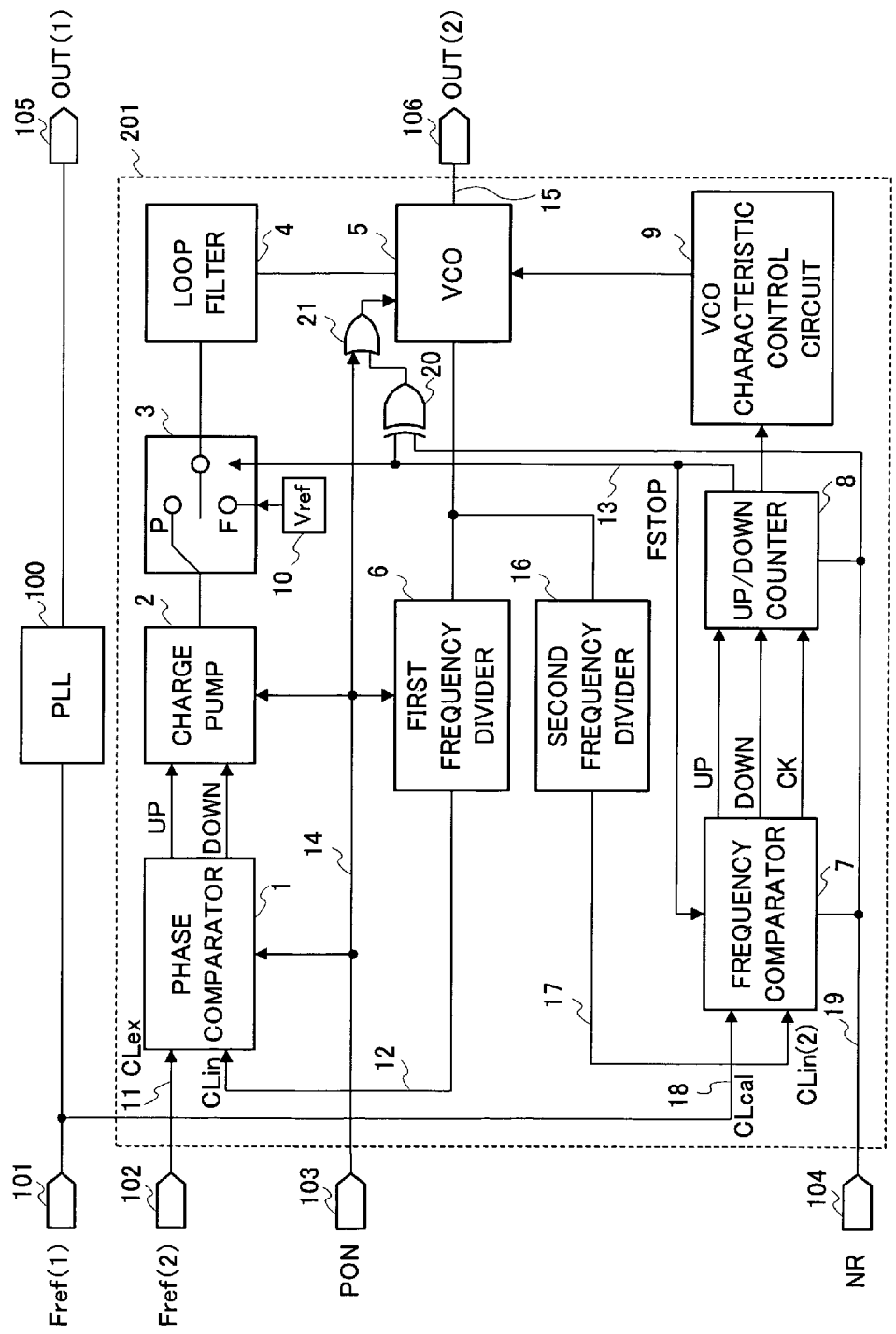
FIG. 7 is a view showing an example of the configuration of a multiplication clock generator concerning an embodiment 4 of the invention.
Figure 8:
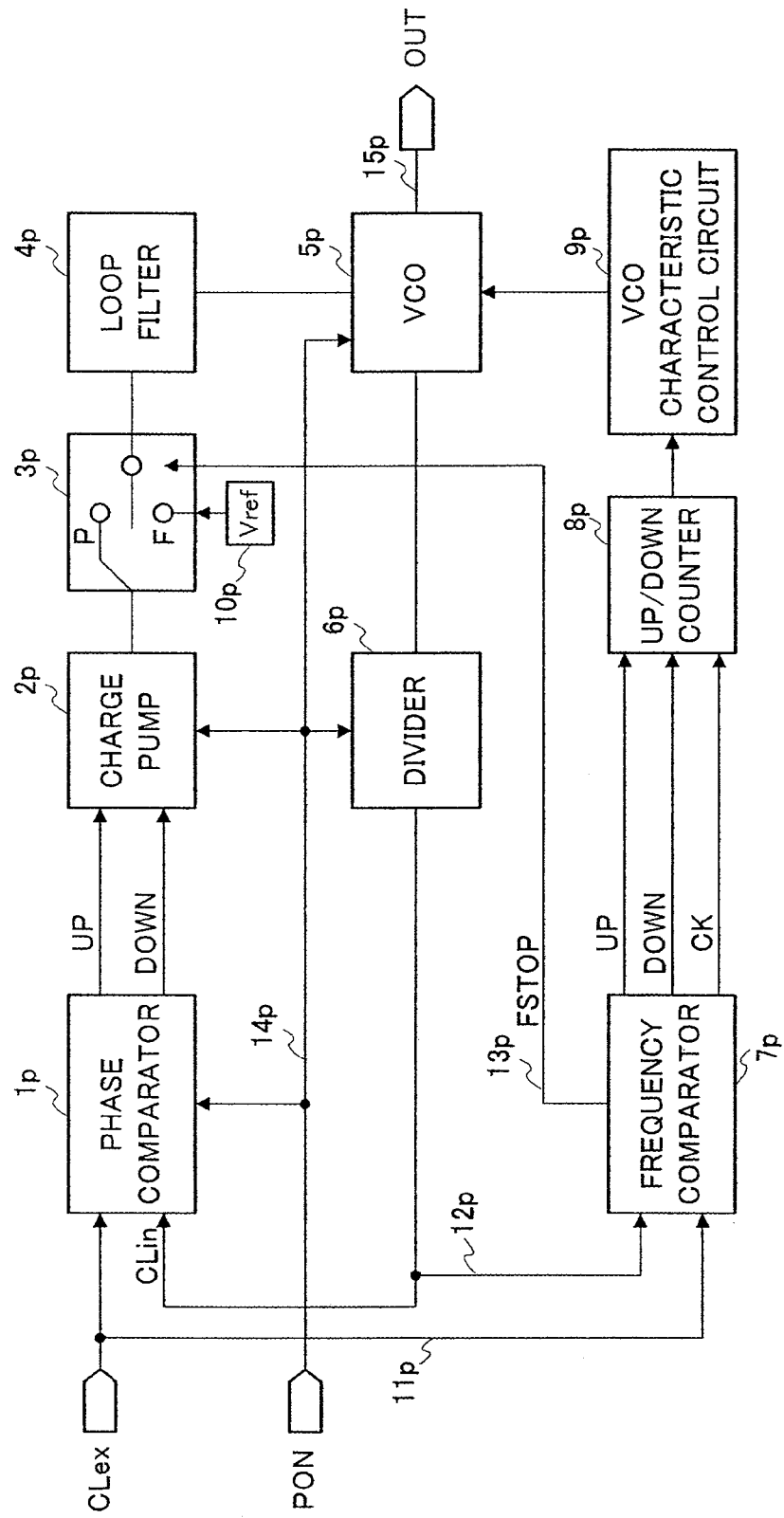
FIG. 8 is a view showing an example of the circuit configuration of a conventional dual loop PLL.

FIG. 7 is a view showing an example of the configuration of a multiplication clock generator concerning an embodiment 4 of the invention. The multiplication clock generator of this embodiment employs a configuration wherein the oscillator control circuit shown in FIG. 5 is added to the second PLL 200 of the multiplication clock generator of FIG. 6.

The multiplication clock generator shown in FIG. 7 comprises the first PLL 100 and a second PLL 201, wherein the second PLL 201 is the one in which the EX-OR circuit 20 and the OR circuit 21 shown in FIG. 5 are added. Moreover, the multiplication clock generation circuit shown in FIG. 7 comprises, as its inputs, the first reference clock input Fref(1) 101, the second reference clock input Fref(2) 102, the power-on control input PON 103 of the second PLL, and the reset input NR 104 of the second PLL. Moreover, the multiplication output OUT(1) 105 of the first PLL and the multiplication output OUT(2) 106 of the second PLL are prepared as its outputs.

In addition, because in FIG. 7, elements of the same numerals as those of FIG. 1, FIG. 5, and FIG. 6 have the same names and same functions, the descriptions thereof are omitted The second PLL 201, which is included the multiplication clock generator in this embodiment, is the dual loop PLL shown in FIG. 5, and the calibration clock line CLcal 18 of the second PLL 201 is coupled to the first reference clock input Fref(1) 101.

In the multiplication clock generator shown in FIG. 7, even when the second reference clock input Fref(2) 102 is being stopped, a signal is inputted from the first reference clock Fref(1) 101 input, and a reset release signal is inputted from the reset input NR 104 of the second PLL 200, and thereby the V-F characteristic control (PLL calibration) of the voltage controlled oscillator 5 through the frequency comparison loop of the second PLL 200 can be carried out.

The first reference clock and the second reference clock can be selected in the same way as the embodiment 3.

In this way, according to the multiplication clock generator of this embodiment, in addition to the effect of the lock-up time reduction during the initial start-up of the second PLL 200 in the multiplication clock generator described in the embodiment 3, and the effect of the power dissipation reduction wherein the second reference clock input Fref(2) 102 is stopped until when the start-up of the second PLL 201 is needed, it is possible to stop the operation of the voltage controlled oscillator 5, which the second PLL 201 has, after carrying out the PLL calibration during the initial start-up of the second PLL 201. It is therefore further effective in reduction of the power dissipation of systems than the multiplication clock generator in the embodiment 3 described above.

Consequently, the dual loop PLL and the multiplication clock generator concerning the invention have an effect of the lock-up time reduction of the dual loop PLL and an effect of the power dissipation reduction as the multiplication clock generator, and are useful as the clock generator or the like in digital systems having digital circuitry operating intermittently, and are also applicable for use in terminals or the like of portable communication apparatus.

The present invention is not limited to the above described embodiments, and various variations and modifications can be made without departing from the scope of the present invention.

This application is based on the Japanese Patent Application No. 2005-001547 filed on Jan. 6, 2005, entire content of which is expressly incorporated by reference herein.

What is claimed is:

1. A dual loop PLL, comprising:
a phase comparison loop having a phase comparator for comparing phases;
a frequency comparison loop having a frequency comparator for comparing frequencies, wherein the frequency comparator carries out frequency comparison using an input signal different from a reference clock input signal used for the phase comparator;
a voltage controlled oscillator that oscillates a clock by controlling a voltage, the voltage controlled oscillator being shared between the phase comparison loop and the frequency comparison loop; and
an oscillator control circuit that stops the operation of the voltage controlled oscillator,
wherein the oscillator control circuit stops the voltage controlled oscillator after completing the frequency comparison operation through the frequency comparison loop and before starting the phase comparison operation through the phase comparison loop.

2. A multiplication clock generator, comprising:
a first PLL (Phase Looked Loop) that receives and multiplies a first reference clock and outputs a first clock; and
a second PLL that receives and multiplies a second reference clock and outputs a second clock,
wherein the second PLL comprises a dual loop PLL having a phase comparison loop having a phase comparator for comparing phases, and a frequency comparison loop having a frequency comparator for comparing frequencies,
wherein the phase comparator which the second PLL comprises carries out phase comparison using the second reference clock, and the frequency comparator which the second PLL comprises carries out frequency comparison using the first reference clock;
the second PLL further comprising a voltage controlled oscillator that oscillates a clock by controlling a voltage, the voltage controlled oscillator being shared between the phase comparison loop and the frequency comparison loop, and an oscillator control circuit that stops the operation of the voltage controlled oscillator,
wherein the oscillator control circuit stops the voltage controlled oscillator after completing the frequency comparison operation through the frequency comparison loop and before starting the phase comparison operation through the phase comparison loop.

* * * * *